(12) United States Patent
Tan et al.

(10) Patent No.: US 9,087,813 B2
(45) Date of Patent: Jul. 21, 2015

(54) CONTROL GATE

(71) Applicant: GLOBALFOUNDRIES Singapore Pte. Ltd., Singapore (SG)

(72) Inventors: Shyue Seng Tan, Singapore (SG); Lee Wee Teo, Singapore (SG); Chunshan Yin, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/174,804

(22) Filed: Feb. 6, 2014

(65) Prior Publication Data
US 2014/0151775 A1 Jun. 5, 2014

Related U.S. Application Data

(62) Division of application No. 12/621,527, filed on Nov. 19, 2009, now Pat. No. 8,647,946.

(51) Int. Cl.
| | |
|---|---|
| *H01L 29/423* | (2006.01) |
| *B82Y 10/00* | (2011.01) |
| *H01L 21/28* | (2006.01) |
| *H01L 29/10* | (2006.01) |
| *H01L 29/66* | (2006.01) |
| *H01L 29/788* | (2006.01) |
| *H01L 29/792* | (2006.01) |
| *H01L 21/265* | (2006.01) |

(52) U.S. Cl.
CPC ........... *H01L 29/42364* (2013.01); *B82Y 10/00* (2013.01); *H01L 21/28273* (2013.01); *H01L 21/28282* (2013.01); *H01L 29/1045* (2013.01); *H01L 29/42328* (2013.01); *H01L 29/42344* (2013.01); *H01L 29/66825* (2013.01); *H01L 29/66833* (2013.01); *H01L 29/7881* (2013.01); *H01L 29/792* (2013.01); *H01L 21/26586* (2013.01)

(58) Field of Classification Search
CPC ................... H01L 29/42364; H01L 21/28273; H01L 21/28282; H01L 29/1045; H01L 29/42328; H01L 29/66825; H01L 29/66833; H01L 29/792; B82Y 10/00
See application file for complete search history.

(56) References Cited

U.S. PATENT DOCUMENTS

| | | | |
|---|---|---|---|
| 2008/0093647 A1 | 4/2008 | Kang et al. | |
| 2009/0212351 A1 | 8/2009 | Chen | |
| 2009/0256193 A1 | 10/2009 | Ishii et al. | |
| 2009/0273013 A1 | 11/2009 | Winstead et al. | |
| 2010/0078703 A1* | 4/2010 | Winstead et al. | 257/324 |

* cited by examiner

Primary Examiner — Long Pham
(74) Attorney, Agent, or Firm — Horizon IP Pte. Ltd.

(57) ABSTRACT

A method for forming a semiconductor device is disclosed. The method includes providing a substrate prepared with a second gate structure. An inter-gate dielectric is formed on the substrate and over the second gate. A first gate is also formed. The first gate is adjacent to and separated from the second gate by the inter-gate dielectric. The substrate is patterned to form a split gate structure with the first and second adjacent gates. The split gate structure is provided with an e-field equalizer adjacent to the first gate. The e-field equalizer improves uniformity of e-field across the first gate during operation.

20 Claims, 19 Drawing Sheets

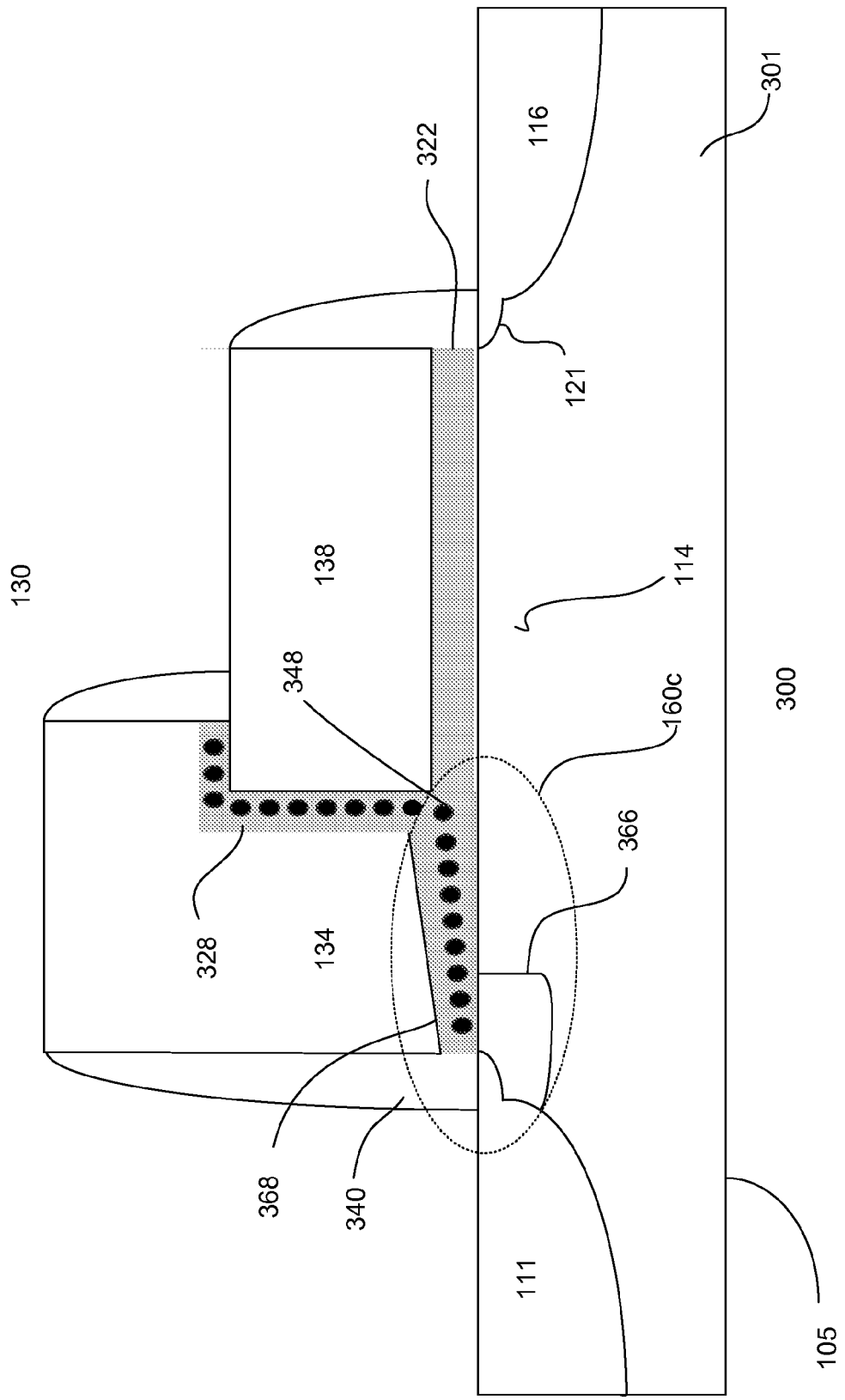

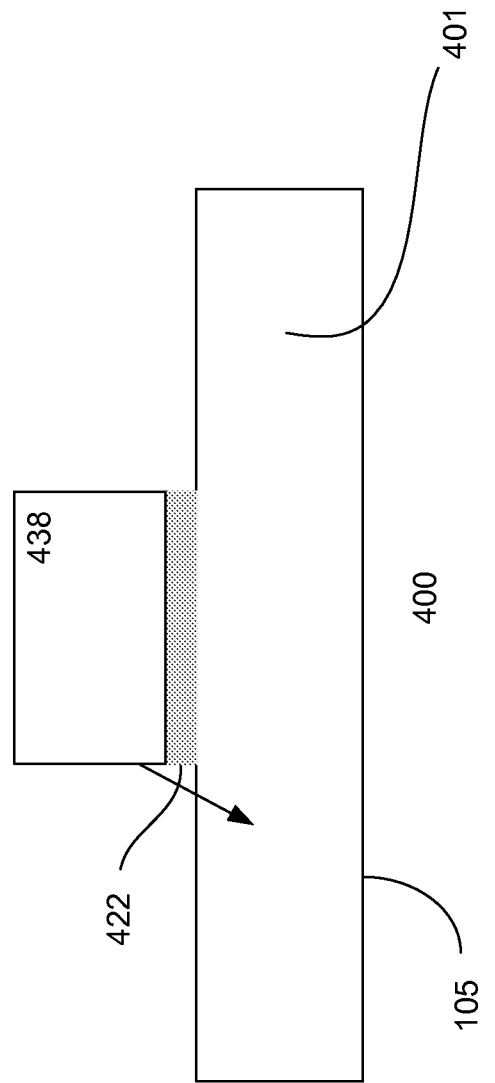

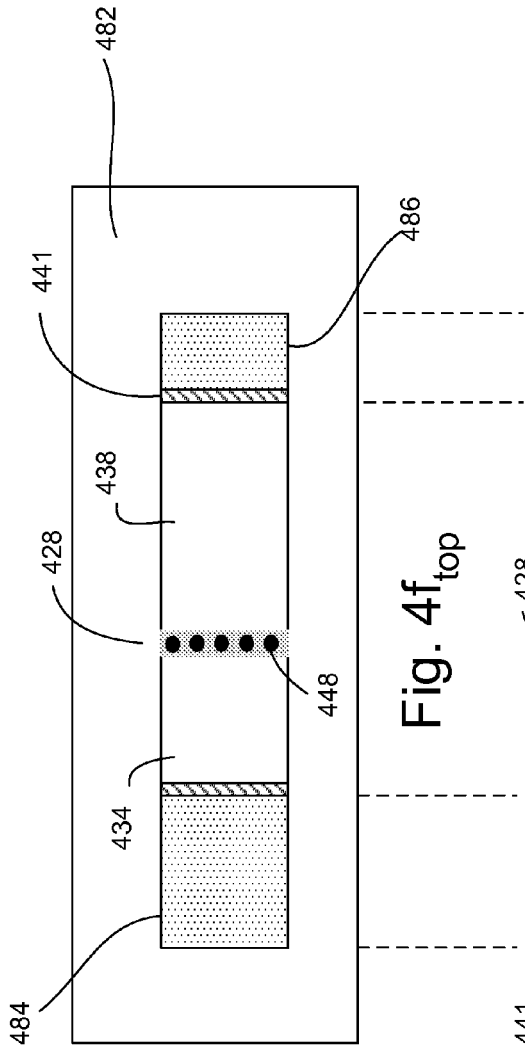
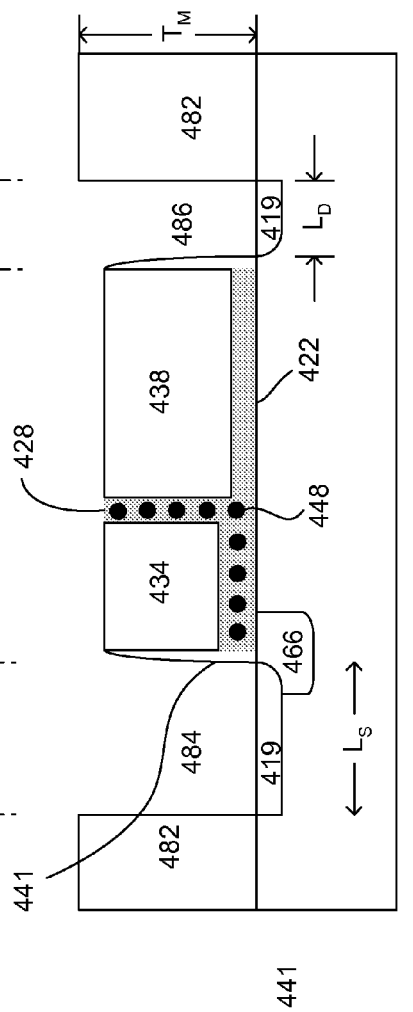

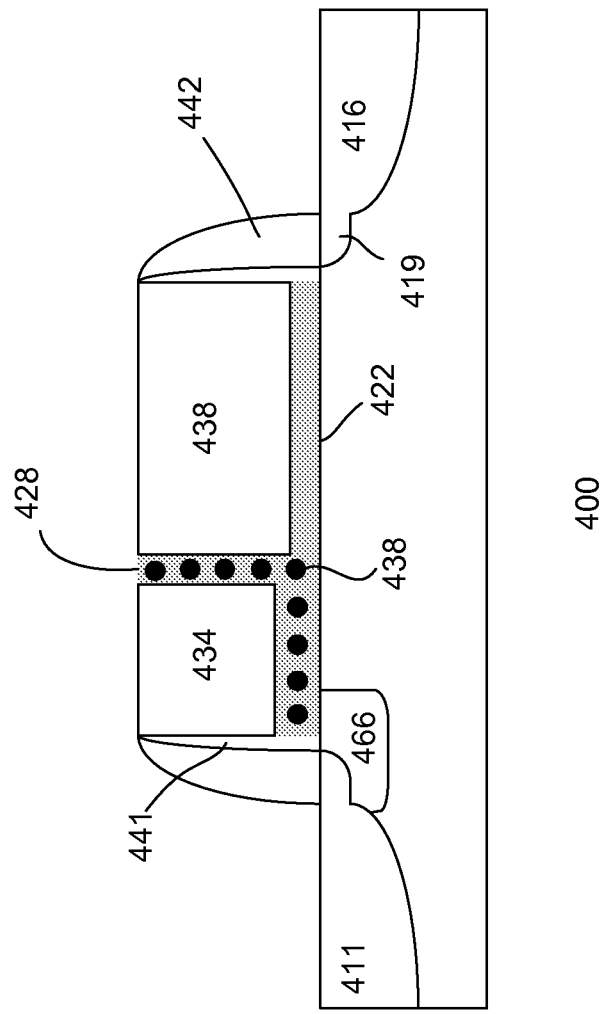

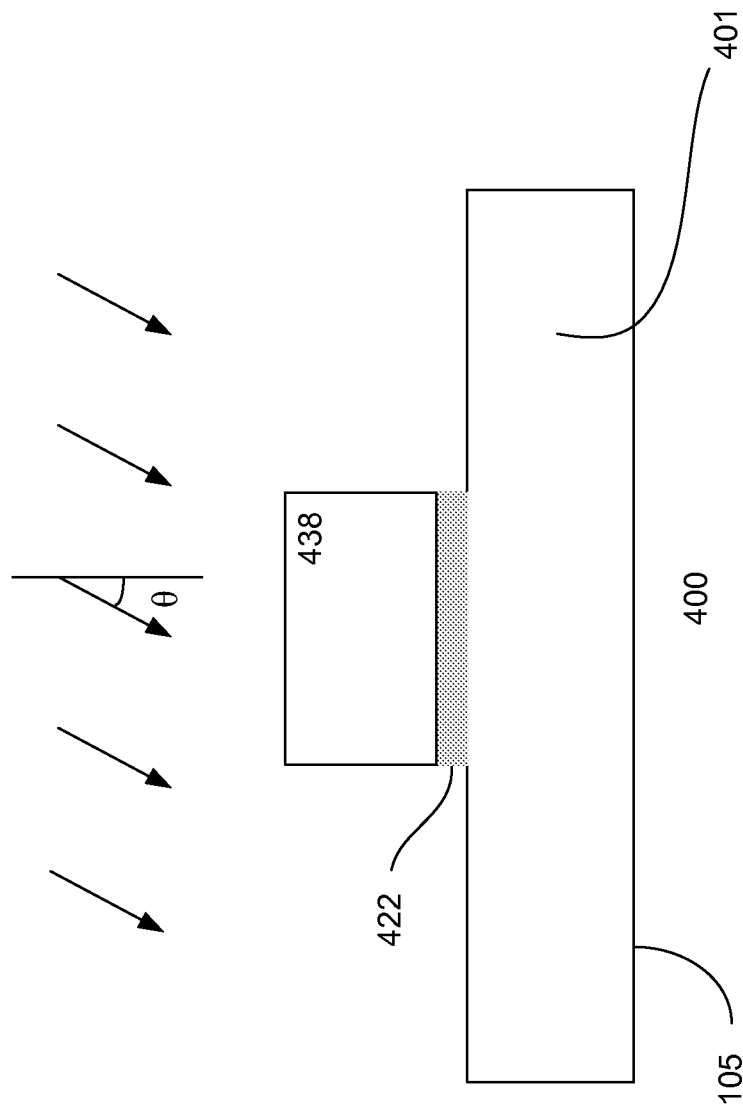

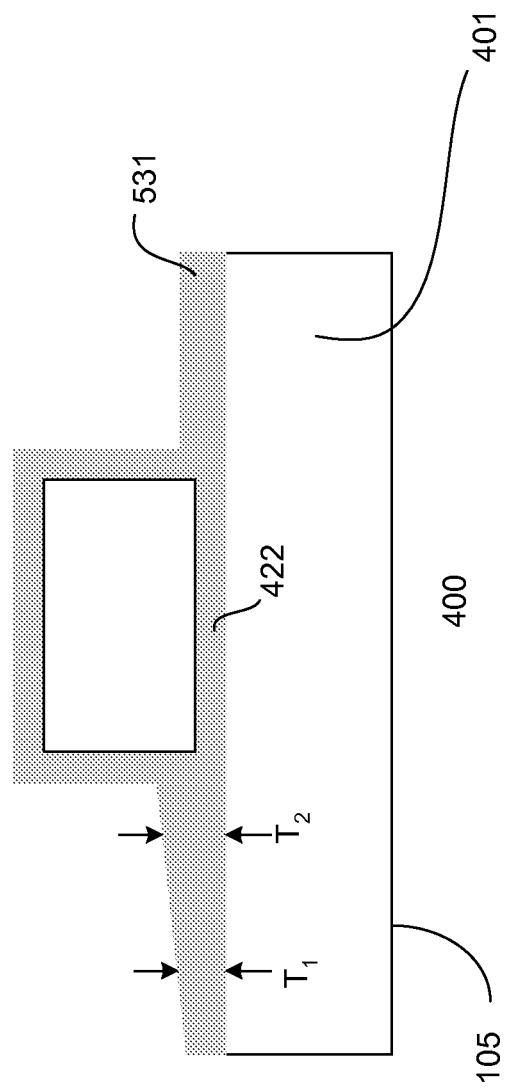

CONTROL GATE

CROSS-REFERENCES TO RELATED APPLICATIONS

This application is a divisional application of co-pending U.S. patent application Ser. No. 12/621,527 filed Nov. 19, 2009. The application is hereby incorporated by reference in its entirety.

BACKGROUND

Non-volatile memory (NVM) circuits have achieved widespread adoptions for code and data storage applications. An important aspect of NVM circuits is their performance, which includes programming speed and data retention after write/erase cycling. Programming the memory to a program state involves, for example, injecting hot electrons into the gate dielectric of the floating or select gate of the memory cell, while erasing involves discharging the gate dielectric by (Fowler-Nordheim) FN tunneling.

Nano-crystal device layers, such as silicon nano-crystals or germanium nano-crystals are used in semiconductor processing. For example, nano-crystal device layers have been widely used in Non-volatile memory (NVM) devices. NVM devices have achieved widespread adoptions for code and data storage applications.

In conventional NVM devices, we have discovered that during programming of the memory cell, the electric field (e-field) generated for charging of the nano-crystals is not uniform across the nano-crystals. This results in slower programming speed and poor data retention due to cross-talk between the adjacent nano-crystals.

SUMMARY

A method for forming a semiconductor device is disclosed. The method includes providing a substrate prepared with a second gate structure. An inter-gate dielectric is formed on the substrate and over the second gate. A first gate is also formed. The first gate is adjacent to and separated from the second gate by the inter-gate dielectric. The substrate is patterned to form a split gate structure with the first and second adjacent gates. The split gate structure is provided with an e-field equalizer adjacent to the first gate. The e-field equalizer improves uniformity of e-field across the first gate during operation.

Another embodiment of forming a semiconductor device is also presented. The method includes providing a substrate with a feature. The substrate is implanted with dopants. The implant produces dopant concentrations on the substrate with a gradient. A device layer is also formed. The device layer has a thickness gradient. The thickness gradient is dependent on the dopant concentration gradient on the substrate.

In yet another embodiment, a semiconductor device is disclosed. The device includes a substrate and a second gate disposed on the substrate. It also includes an inter-gate dielectric layer disposed on the substrate and over the second gate. A first gate is adjacent to and separated from the second gate by the inter-gate dielectric. In addition, an e-field equalizer is adjacent to the first gate. The e-field equalizer improves uniformity of an e-field across the first gate during operation.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 3a-f show cross-sectional views of embodiments of various memory cells;
FIGS. 4a-g show an embodiment of a process for forming a memory cell;
and
FIGS. 5a-d show another embodiment of a process for forming a memory cell.

DETAILED DESCRIPTION

Embodiments generally relate to semiconductor processing and fabricating semiconductor devices. Some embodiments relate to memory devices, such as non-volatile memory devices. Such memory devices, for example, can be incorporated into standalone memory devices, such as USB or other types of portable storage units, or ICs, such as microcontrollers or system on chips (SoCs). Processing of other types of devices is also useful. The devices or ICs can be incorporated into or used with, for example, consumer electronic products, such as computers, cell phones, and personal digital assistants (PDAs).

Figure 1:
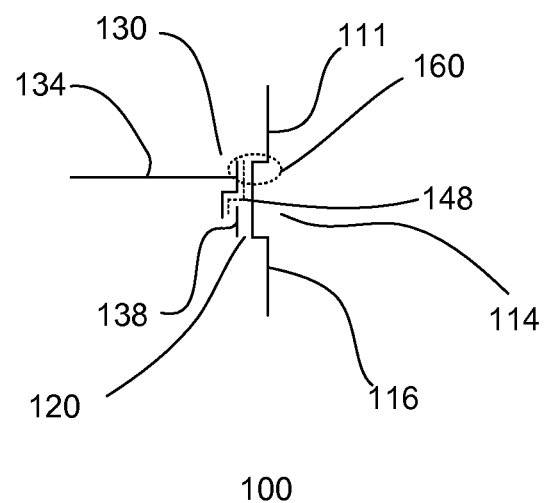
FIG. 1 shows an embodiment of a memory cell.

FIG. 1 shows a schematic diagram of an embodiment of a memory cell 100. The memory cell, in one embodiment, comprises a non-volatile memory cell. The memory cell comprises a transistor with a gate 130 over a channel 114 and between first and second terminals 111 and 116. The gate comprises a split gate having a first gate 134 and a second gate 138. In one embodiment, the first gate comprises a control gate, the first terminal comprises a source terminal, the second gate comprises a select gate and the second terminal comprises a drain terminal. Other configurations of terminals are also useful. For example, the first terminal can be a drain terminal, the second terminal can be a source terminal.

In one embodiment, the first gate is adjacent to the second gate. For example, the control gate is adjacent to the select gate. The gates are disposed over the channel region. In one embodiment, a portion of the first gate is disposed over the channel region. A dielectric layer or layers 120 isolate the gates from each other and the channel. Alternatively, the first gate overlaps a portion of the second gate. For example, the control gate is disposed over the channel and partially overlaps the select gate in an overlap region.

In one embodiment, the dielectric layer isolating the gates and the first gate from the substrate comprises nano-crystals 148. For example, the dielectric layer can comprise silicon oxide with silicon nano-crystals. Other types of dielectric materials and/or nano-crystals that have charge storage capacity are also useful. For example, the nano-crystals can comprise germanium nano-crystals.

The control gate is coupled to a control gate voltage source ($V_{cg}$), the select gate is coupled to a select gate voltage source ($V_{sg}$), the source terminal is coupled to a source voltage source ($V_s$), and the drain is coupled to a drain voltage source ($V_d$). For example, $V_{cg}$ can be about 0-15 V, $V_{sg}$ can be about 0-3V, $V_d$ can be about 0-3V and $V_s$ can be about 0-6 V. The appropriate voltages are supplied to the memory cell to access the memory cell, such as erasing, programming and reading. For example, to program the memory cell, $V_{cg}$ is equal to about 9 V, $V_{sg}$ is equal to about 1.2 V and $V_s$ is equal to about 5V. As for $V_d$, it depends on whether a one or a zero is to be programmed into the memory cell. For example, $V_d$ is equal to about 0V for writing a one while about 5V for writing a zero. For erasing the memory cell, $V_{cg}$ is equal to about 14 V while $V_{sg}$, $V_d$ and $V_s$ are equal to about 0 V. In the case of a read operation, $V_{cg}$ and $V_{sg}$ are equal to about 1.2 V, $V_d$ is equal to about 0V and $V_s$ is equal to about 0.5V. Other voltage values can be supplied to the memory cell, for example, depending on the technology.

In one embodiment, the memory cell comprises an e-field equalizer 160. The e-field equalizer is disposed adjacent to one of the first and second gates. In one embodiment, the e-field equalizer is disposed adjacent to the first or control gate. The e-field equalizer controls the e-field at the first gate. For example, the e-field equalizer facilitates or improves e-field uniformity at the control gate. In one embodiment, the e-field equalizer improves the uniformity of the e-field at the control gate by controlling the lateral e-field underneath the control gate. By providing a more uniform e-field at the control gate and extending the high e-field towards the source end, more nano-crystals would be subjected to charge trapping, which can increase programming speed and data retention. As a result, a larger $V_t$ shift can be achieved.

Figure 2:
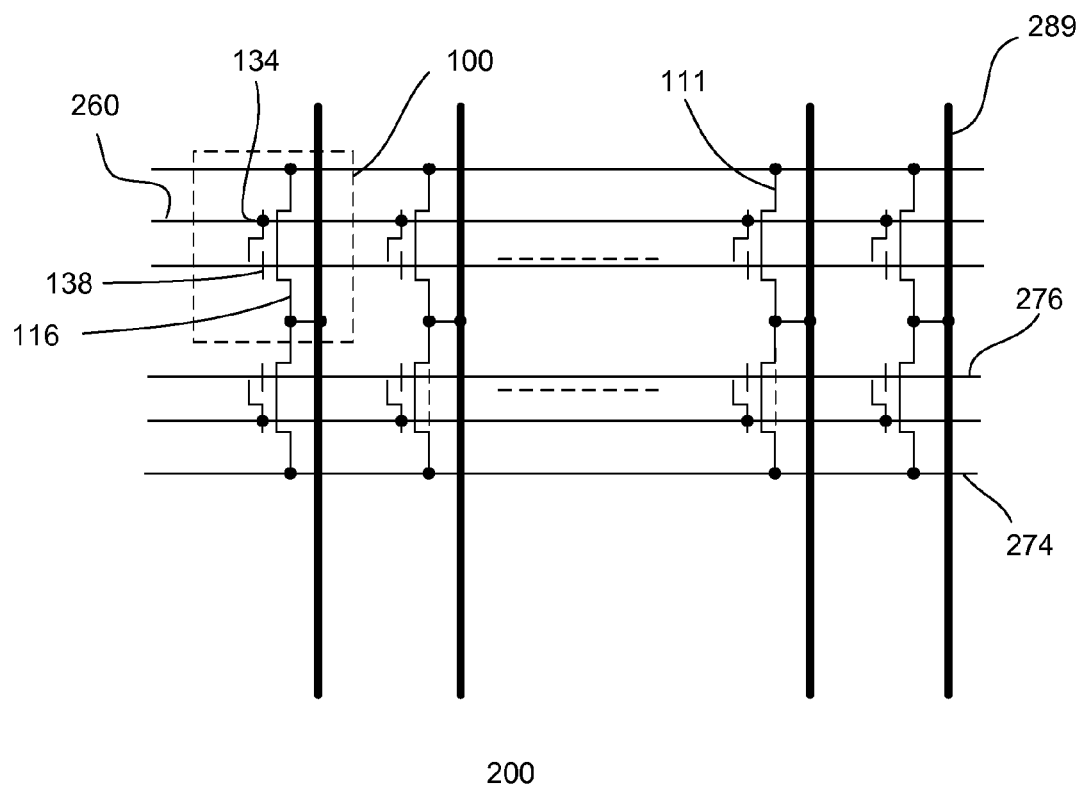
FIG. 2 shows an embodiment of a memory array.

FIG. 2 shows an embodiment of a memory array 200. In one embodiment, the memory array comprises a non-volatile memory array. The memory array comprises a plurality of memory cells arranged in rows and columns. The memory cells, for example, comprise memory cells 100 as described in FIG. 1. A row corresponds to, for example, a wordline (WL) 260 and a column corresponds to a bitline (BL) 289 of the array. In one embodiment, the BLs are coupled to the second or drain terminals 116 while WLs are coupled to the first or control gates 134 of the memory cells. For example, WLs provide $V_{cg}$, BLs provide $V_d$. Source lines (SLs) 274 may be employed to provide $V_s$ to the first or source terminals 111; select gate lines or SGLs 276 may be used to provide $V_{sg}$ to the second or select gates 138 of the memory cells. SLs and SGLs maybe coupled to the memory cells as desired. The memory cells may be configured in a NOR type array architecture. Arranging the memory cells in other types of array architectures, such as NAND, is also useful.

FIGS. 3a-f show a portion 300 of various embodiments of a device or IC. As shown, the portion comprises various embodiments of a memory cell. The portion includes a substrate 105. The substrate, for example, comprises a silicon substrate. The substrate can be lightly doped with p-type dopants. Other types of substrates, such as silicon germanium or silicon-on-insulator (SOI), are also useful.

The substrate can be prepared with a region 301 containing memory cells 100. In one embodiment, the memory cells comprise non-volatile memory cells. Other types of memory cells are also useful. The region can be referred to as an array region. The array region shows one memory cell. Although only one memory cell is shown, it is understood that a plurality of memory cells can be included in the device. The array region can be arranged to have sub-regions corresponding to, for example, groups of memory cells. The array region comprises heavily doped well or wells (not shown) with dopants of a first polarity type. In one embodiment, the doped wells comprise dopant concentration of about 1E16 $cm^{-3}$ to 1E18 $cm^{-3}$. Other dopant concentration may also be useful. The first polarity type can be n-type or p-type, depending on the memory cell type. The first polarity type wells are used for second polarity type memory cells. For example, n-type wells are used for p-type memory cells while p-type wells are used for n-type memory cells. P-type dopants can include boron (B), aluminum (Al) or a combination thereof while n-type dopants can include phosphorus (P), arsenic (As), antimony (Sb) or a combination thereof.

Additionally, the substrate may include non-array regions (not shown), such as logic portions for support circuitry. The substrate may also include other regions for other types of circuitry, depending on the type of device or IC. The logic portion, for example, can include low voltage (LV), high voltage (HV) and dual gate oxide (DGO) devices. The DGO devices, for example, are used for I/O circuitries.

The substrate includes isolation regions (not shown) to, for example, isolate active device regions from other active device regions, as required. The isolation regions, for example, comprise shallow trench isolation (STI) regions. Other types of isolation regions are also useful.

In one embodiment, a memory cell comprises a transistor with a gate 130 between first and second terminals 111 and 116. The terminals can comprise, for example, diffusion regions. The first terminal, for example, serves as a source and the second terminal serves as a drain. The source and drain comprise, for example, second polarity type dopants. The memory cell may also comprise extension regions 121 which are shallower and extends underneath the spacers to the gate edge.

Figure 3A:
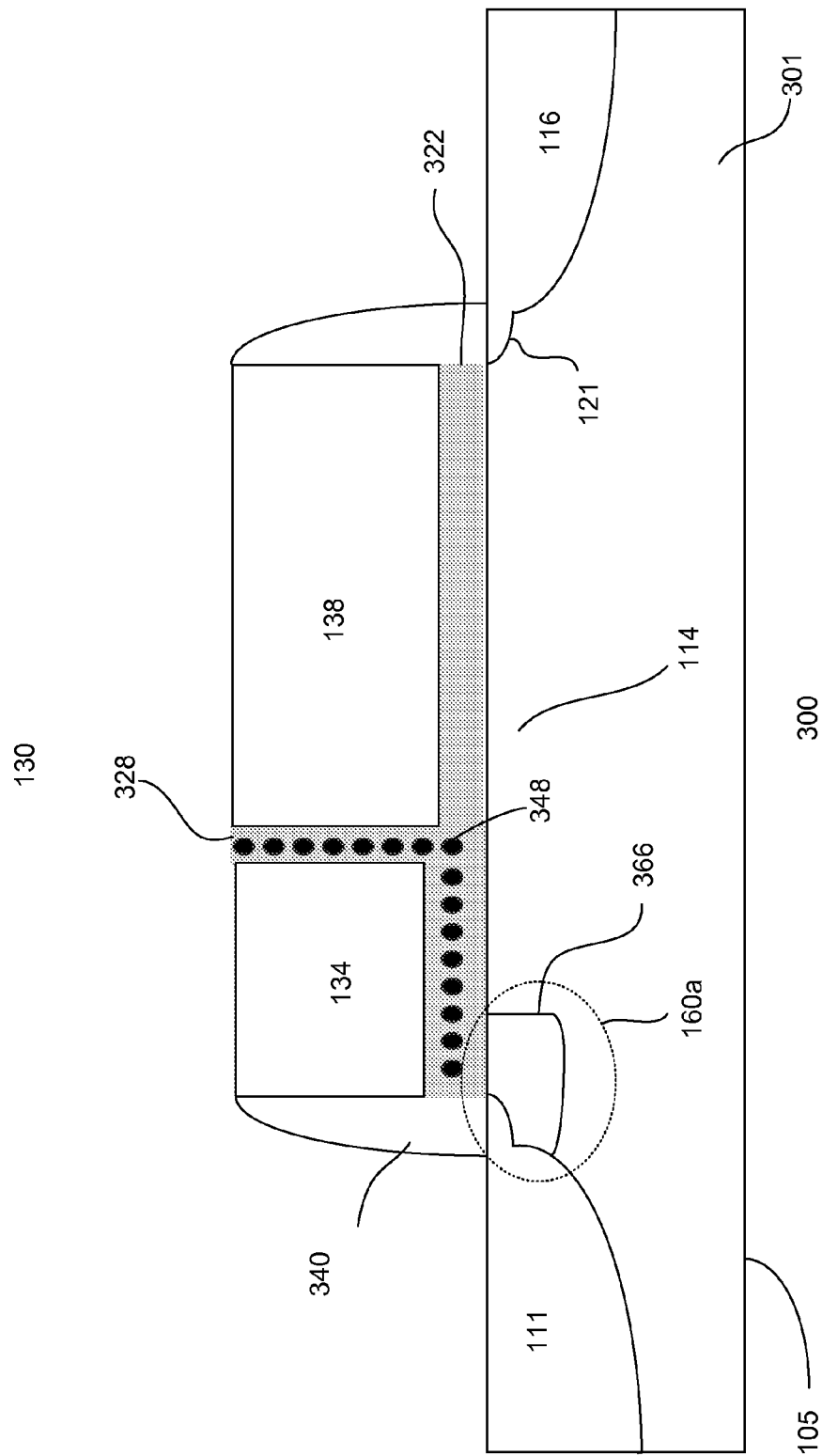
Figure 3B:
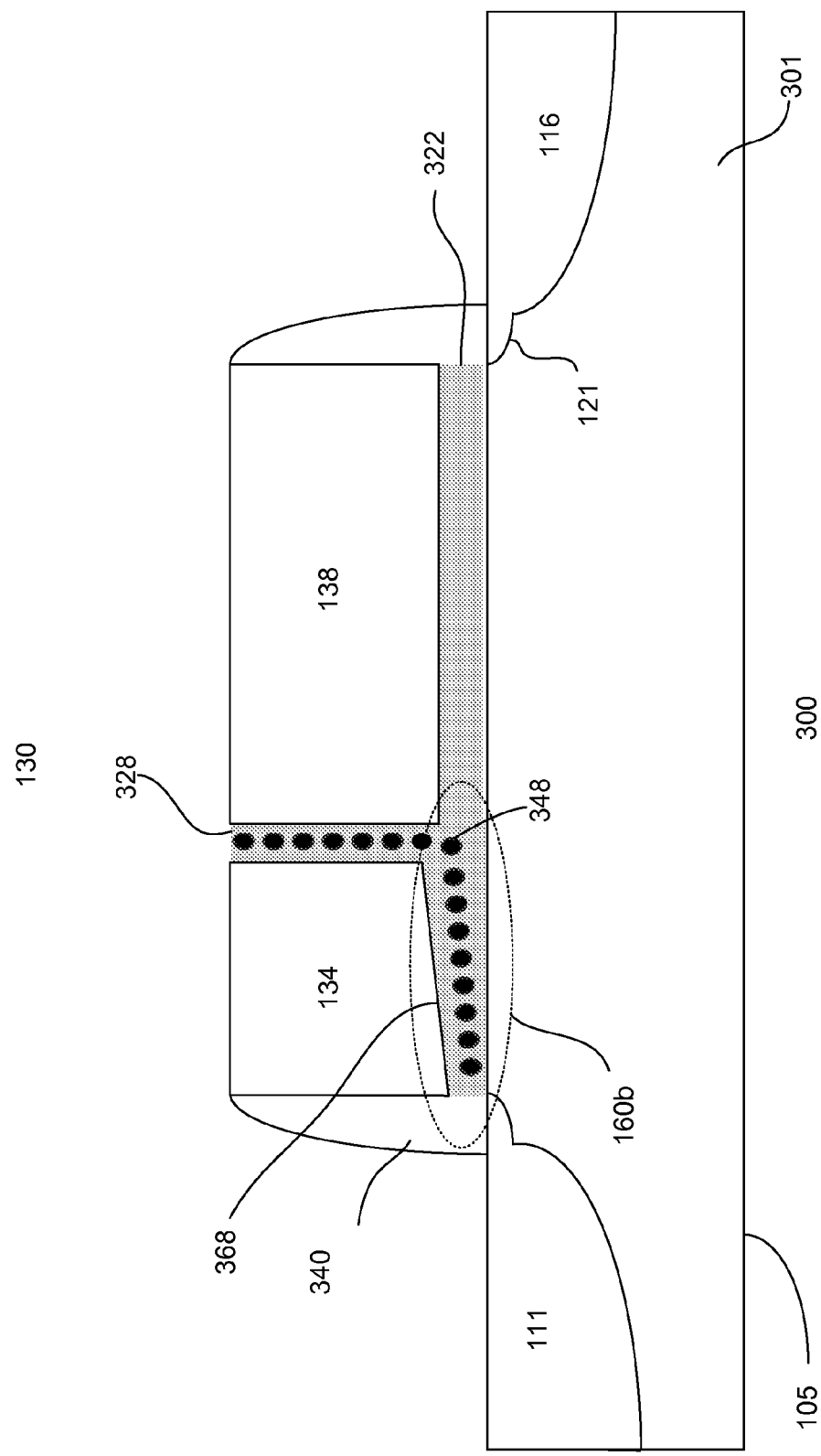
Figure 3C:
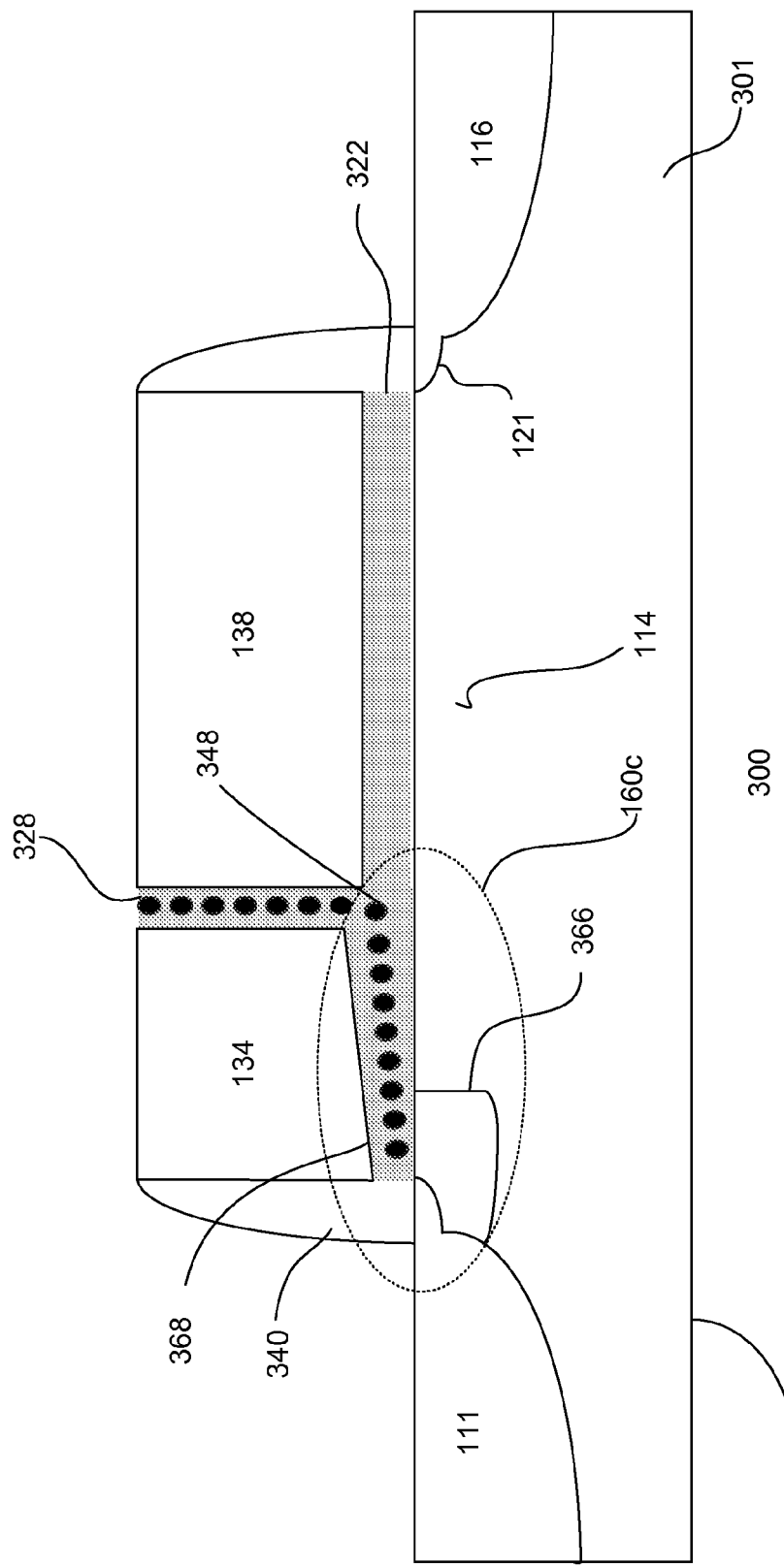
Figure 3D:
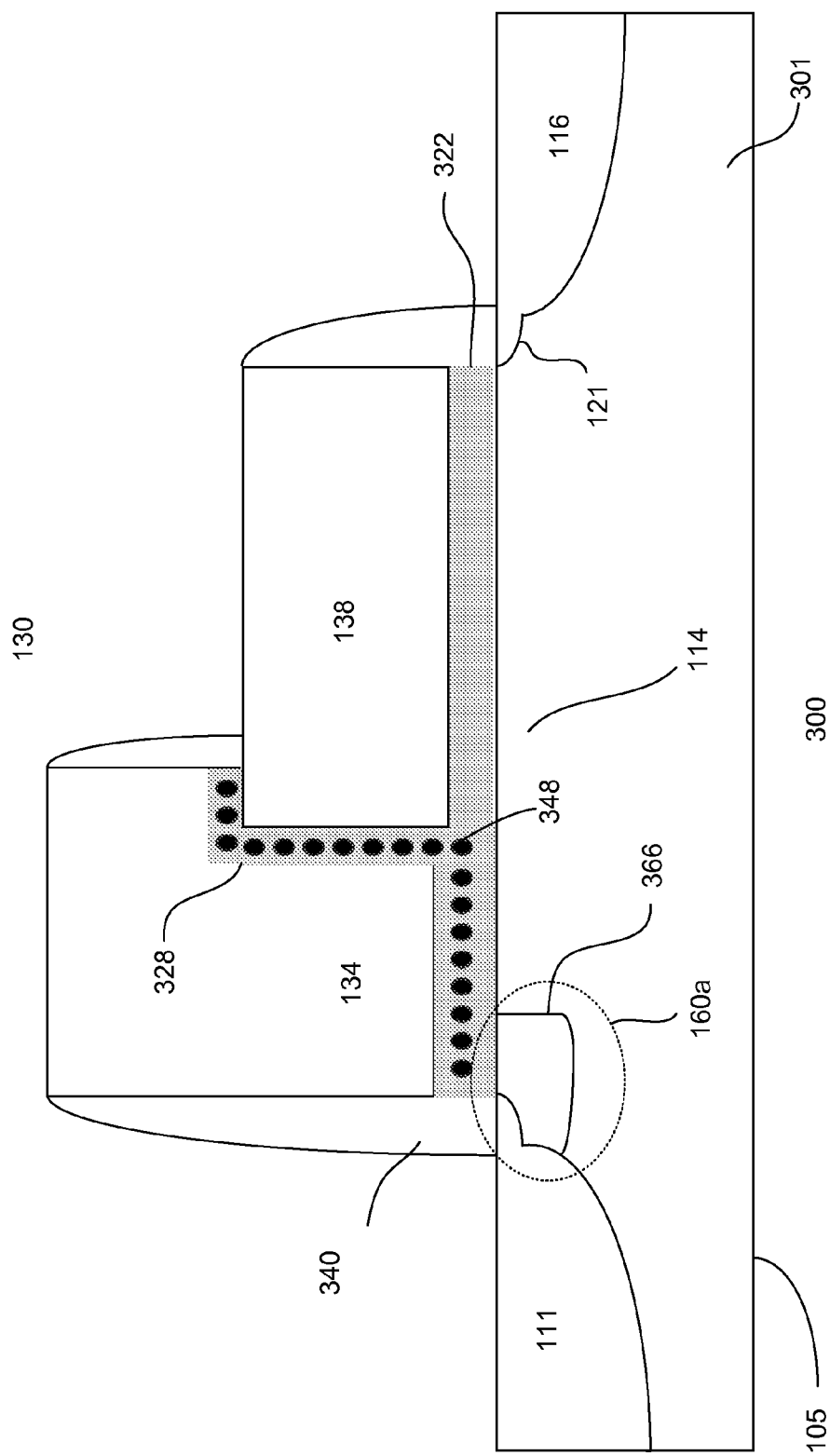
Figure 3E:
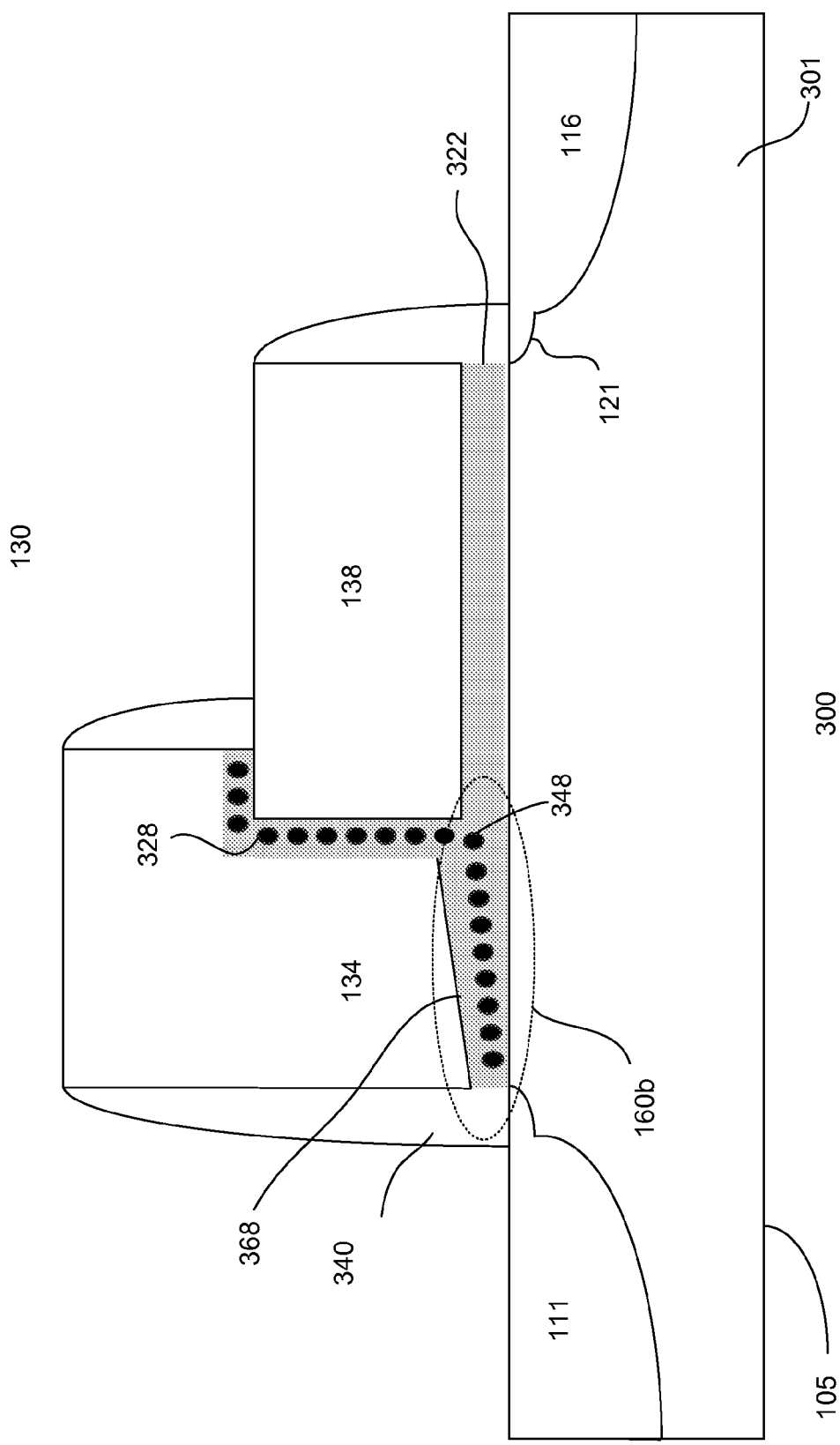

The gate, in one embodiment, comprises a split gate with first and second gates 134 and 138. For example, the first gate can be a control gate and the second gate can be a select gate. In one embodiment, the first and second gates are adjacent gates disposed on the surface of the substrate. As shown in FIGS. 3a-c, the first and second gates have co-planar top surfaces. Providing gates with non-coplanar top surfaces may also be useful. For example, the first gate can be adjacent to and overlaps the second gate, as shown in FIGS. 3d-f. In one embodiment, the first gate is adjacent to and overlaps a portion of the second gate, leaving a portion of the second gate uncovered by the first gate in a non-overlap region.

The gates are isolated from each other and the substrate by a dielectric layer. In one embodiment, the dielectric layer comprises a plurality of dielectric layers. For example, the dielectric layer comprises a second gate dielectric layer 322 and an inter-gate dielectric layer 328 provided to separate the first gate from the second gate and the substrate. The second gate dielectric layer, for example, is a select gate dielectric layer which separates the select gate from the substrate. The second gate dielectric layer may be, for example, a LV type gate dielectric layer. Other types of second gate dielectric layers may also be employed. Dielectric sidewall spacers 340 can be provided on sidewalls of the gates. The dielectric sidewall spacers, for example, comprise silicon oxide. Other types of dielectric material can also be used to form the spacers.

In one embodiment, the inter-gate dielectric layer comprises nano-crystals 348. The inter-gate dielectric layer, for example, comprises oxide with silicon nano-crystals. Other types of inter-gate dielectric layers are also useful. For example, the inter-gate dielectric layer can comprise a high-K dielectric material and/or other types of nano-crystals, such as germanium nano-crystals. The nano-crystals may include a nitrided shell.

The first gate, for example, may be a gate conductor which serves as a common gate for a row of memory cells. Adjacent memory cells can be configured as mirror gate electrodes which may share a common diffusion region. Other configurations or layouts of memory cells are also useful. The gates may also be provided with salicide contacts (not shown).

In conventional memory cells, e-field generated in the channel region of the transistor is non-uniform. For example, the e-field under the control gate near the interface of the select gate is relatively higher due to impact ionization while the e-field at the source-side of the control gate is relatively lower due to nearly uniform inversion charge in the linear region. The non-uniformity of the e-field under the control gate results in un-even charge trapping by the nano-crystals in the inter-gate dielectric layer. More charge trapping by nano-crystals, for example, occurs under the control gate near the interface of the select gate than by nano-crystals under control gate at the source-side.

In one embodiment, an e-field equalizer is provided in the memory cell. The e-field equalizer is disposed adjacent to the control gate. The e-field equalizer provides a more uniform e-field across the control gate during programming, which results in more uniform charge trapping by the nano-crystals. In one embodiment, the e-field equalizer increases the e-field on the source side of the control gate to provide a more uniform e-field across the control gate during programming.

Referring to FIG. 3a and FIG. 3d, one embodiment of the e-field equalizer is shown. The e-field equalizer comprises a heavily doped e-region 366 of the first polarity type adjacent to the first terminal and beneath the first gate. The e-region may comprise higher dopant concentration than the doped well (not shown) of the same polarity type. In one embodiment, the e-region comprises a dopant concentration which is lower than that of the diffusion region of the first terminal. The e-field equalizer controls the lateral e-field underneath the first gate to produce a substantially uniform or more uniform e-field beneath the gate. For example, the heavily doped e-region should be sufficient to increase the e-field under the first gate at the first terminal side to produce a substantially or more uniform e-field across the first gate. The uniformity of the e-field may be improved by 30-50% over applications without an e-field equalizer.

In another embodiment, as shown in FIG. 3b and FIG. 3e, the e-field equalizer 160b comprises a graded inter-gate dielectric layer beneath the first gate. The gradient 368 of the inter-gate dielectric layer beneath the first gate improves uniformity of the e-field under the first gate. A more uniform e-field results in improved charge trapping by the nano-crystals such as during programming. For example, the graded inter-gate dielectric layer increases the effective e-field at the first terminal side of the first gate to improve e-field uniformity under the first gate. Also, the graded inter-gate dielectric layer may increase the effective vertical e-field at the first terminal side while decreasing the effective vertical e-field at the other side of the first gate. Preferably, the gradient and the thickness of the inter-gate dielectric layer should be selected to result in a substantially uniform or uniform e-field under the first gate to result in substantially uniform or uniform carrier injection during programming.

FIG. 3c and FIG. 3f show another embodiment of the e-field equalizer 160c. As shown, the equalizer comprises a heavily doped e-region 366 as described in FIG. 3a and FIG. 3d and a graded inter-gate dielectric layer beneath the first gate, as described in FIG. 3b and FIG. 3e. The dopant concentration of the heavily doped e-region 366 as well as the gradient and thickness of the inter-gate dielectric layer should be optimized to achieve a substantially uniform e-field across the first gate. The graded inter-gate dielectric layer modulates the vertical e-field while the e-region modulates the lateral e-field. This would result in a substantially uniform carrier injection during programming.

Figure 4B:
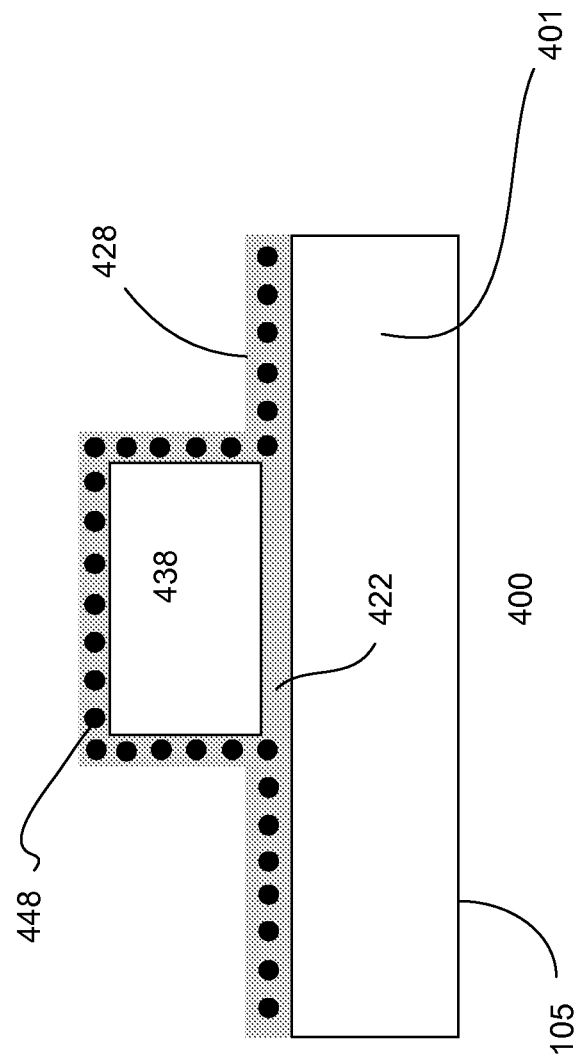

FIGS. 4a-g show cross-sectional views of an embodiment of a process for forming a device or IC. Referring to FIG. 4a, a substrate 105 is provided. The substrate can comprise a silicon substrate, such as a lightly p-type doped substrate. Other types of substrates, including silicon germanium or silicon-on-insulator (SOI), are also useful.

The substrate is prepared with an array region 401 containing memory cells. In one embodiment, the memory cells comprise non-volatile memory cells. Other types of memory cells are also useful. The array region comprises doped wells (not shown) with dopants of a first polarity type. The doped wells may be intermediately or heavily doped wells. The first polarity type can be n-type or p-type, depending on the memory cell type. The first polarity type wells are used for second polarity type memory cells. For example, n-type wells are used for p-type memory cells while p-type wells are used for n-type memory cells. P-type dopants can include boron (B), aluminum (Al), indium (In) or a combination thereof while n-type dopants can include phosphorus (P), arsenic (As), antimony (Sb) or a combination thereof.

Additionally, the substrate may include a logic portion (not shown) for support circuitry. The substrate may also include regions for other types of circuitry, depending on the type of device or IC.

Generally, the IC includes regions with both first and second type wells. To form the doped wells, ion implantation techniques, such as implantation with a mask, can be used. The first and second type wells can be formed in separate processes. Other techniques for forming the active regions are also useful.

The substrate can be prepared with isolation regions (not shown), for example, to separate the active regions from each other and other active device regions. In one embodiment, the isolation regions comprise STIs. Various processes can be employed to form the STI regions. For example, the substrate can be etched using etch and mask techniques to form trenches which are then filled with dielectric materials such as silicon oxide. Chemical mechanical polishing (CMP) can be performed to remove excess oxide and provide a planar substrate top surface. The STI regions can be formed, for example, prior to or after the formation of the doped wells. Other processes or materials can also be used to form the STIs.

The substrate may be implanted with dopants to define the initial gate threshold voltage ($V_T$). Various layers of the second or select gate are formed on the substrate. In one embodiment, a second or select gate dielectric layer 422 is formed on the substrate. The second gate dielectric layer, for example, comprises a LV gate dielectric layer. The second gate dielectric layer, in one embodiment, comprises silicon oxide. Other types of gate dielectric layers, such as silicon oxynitride, may also be used. Various techniques, such as thermal oxidation or CVD, can be employed to form the second gate dielectric layer. The thickness of the second gate dielectric layer may be about 10-100 Å. The second gate dielectric layer can be formed using other types of dielectric materials or thicknesses.

A second gate electrode layer 438 is deposited on the second gate dielectric layer. The second gate electrode layer comprises, in one embodiment, polysilicon. The gate electrode layer can be formed as an amorphous or non-amorphous layer. The gate electrode may be doped. Various techniques may be employed to dope the gate electrode, for example, insitu doping or ion implantation. Providing an undoped gate electrode layer may also be useful. Other types of gate electrode materials are also useful. The thickness of the second gate electrode layer may be about 50-500 Å. In other embodiments, the thickness of the second gate electrode layer may be about 500-2000 Å. Other thicknesses are also useful. To form the second gate electrode layer, techniques such as chemical vapor deposition (CVD), can be used. Other techniques are also useful.

The various second gate layers are patterned. In one embodiment, the various layers are patterned to form a second gate stack. Various techniques, such as masking and etching, can be used to form the second gate stack. For example, a photo-resist layer is formed over the gate layers and patterned, exposing portions of the gate layers. An anisotropic etch, such as a reactive ion etch (RIE), is performed to remove exposed portions of the gate layers. To improve lithographic resolution, an anti-reflective coating (ARC) can be provided beneath the photo-resist.

Referring to FIG. 4b, a first gate dielectric layer 428 is formed on the substrate, covering the second gate stack. The first gate dielectric layer, for example, serves as an inter-gate dielectric layer which separates the first gate from the second gate and the substrate. The first dielectric layer lines the gate stacks, sidewalls, and substrate surface. Forming the inter-gate dielectric layer, in one embodiment, comprises forming multiple layers wherein at least one of the layers includes nano-crystals.

In one embodiment, the inter-gate dielectric layer comprises an inter-gate dielectric stack having multiple sub-layers which include a nano-crystal sub-layer. The inter-gate dielectric stack, in one embodiment, comprises three layers.

The first layer comprises, for example, a thermally grown bottom oxide with a thickness of about 40-150 Å. The bottom oxide can be formed by either steam or dry oxidation at a temperature of about 800-1050° C. Other process parameters and thicknesses are also useful.

As for the second layer, it comprises a layer in which nano-crystals are formed. The second layer is formed over the bottom oxide. In one embodiment, the second layer comprises a polysilicon or amorphous silicon layer which is processed to form silicon nano-crystals. Alternatively, the second layer comprises germanium (Ge) to form Ge nano-crystals. Other types of second layer materials may also be useful, for example, to form other types of nano-crystals. The second layer, for example, can be formed by CVD. To form nano-crystals, the second layer is processed by, for example, an anneal. The anneal can be performed at a temperature of about 750-1100° C. in a $NO/N_2$ or $N_2/O_2$ ambient. The size of the nano-crystals can range from about 30-400 Å. Other processing parameters, types of ambient or nano-crystal size may also be useful. A nitrided shell can be provided to surround the nano-crystals.

The third layer, in one embodiment, comprises an oxide layer formed to cap the nano-crystals by, for example, CVD or rapid thermal CVD (RTCVD). The thickness of the third layer is about 100-250 Å. The dielectric cap layer improves tunneling voltage. In one embodiment, the cap layer comprises a HTO layer. Providing other configurations of the dielectric stack may also be useful. For example, other materials, thicknesses or deposition techniques can be used. Other configurations or types of the inter-gate dielectric layer may also be useful.

Figure 4C:
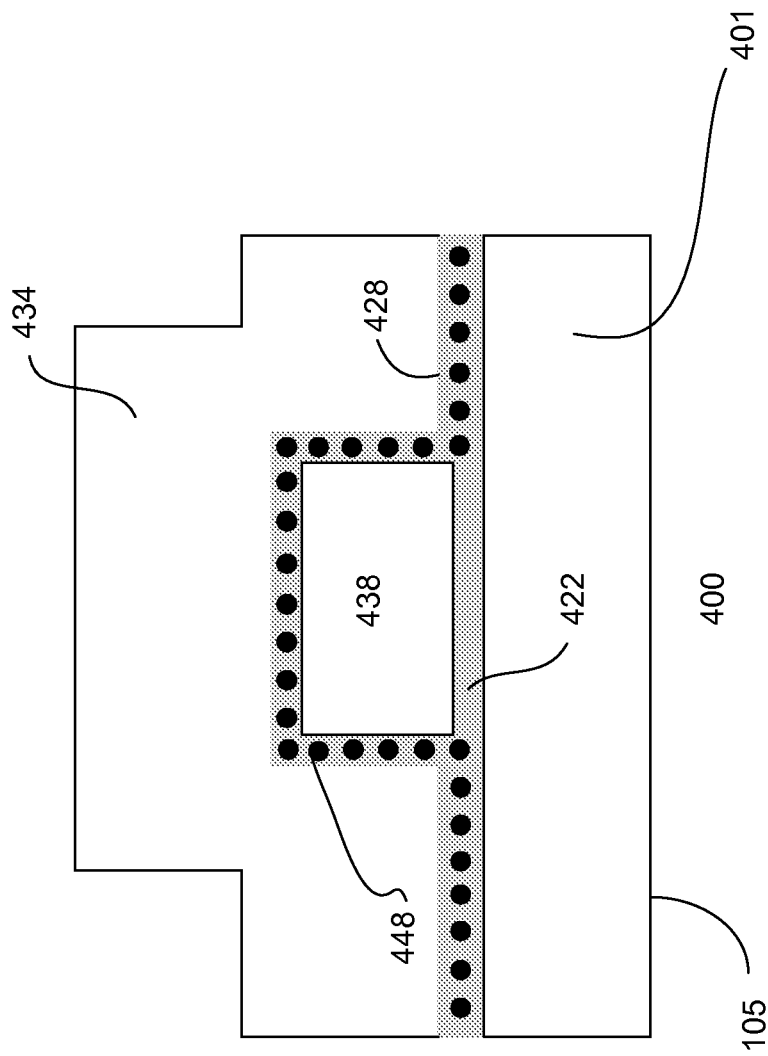

A first gate electrode layer 434 is deposited on the substrate, as shown in FIG. 4c. The first gate electrode layer, in one embodiment, comprises polysilicon. The gate electrode layer can be formed as an amorphous or non-amorphous layer. The gate electrode layer can be doped or undoped. Other types of gate electrode materials are also useful. The thickness of the first gate electrode layer is, for example, about 800-3000 Å. In one embodiment, the thickness of the first gate electrode is at least as thick as the second gate electrode. Other thicknesses are also useful. To form the first gate electrode layer, techniques, such as chemical vapor deposition (CVD), can be used. Other techniques are also useful.

Figure 4D:
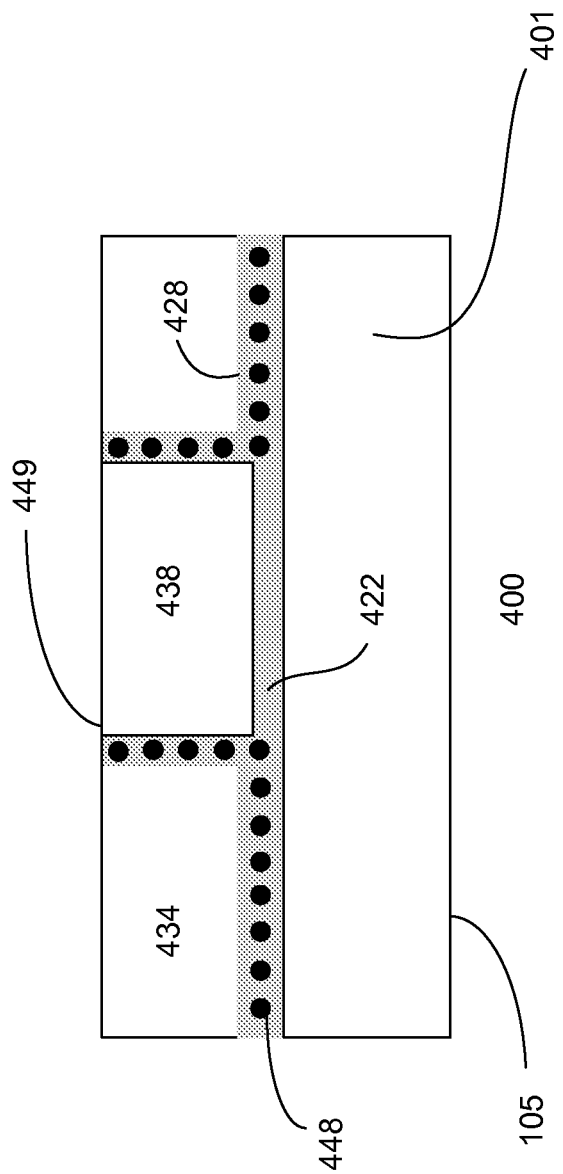

Referring to FIG. 4d, the substrate is planarized to form a planar surface 449 between the inter-gate dielectric layer and first and second gate electrodes. To planarize the substrate, a CMP can be employed. Other planarizing techniques can also be used.

Figure 4E:
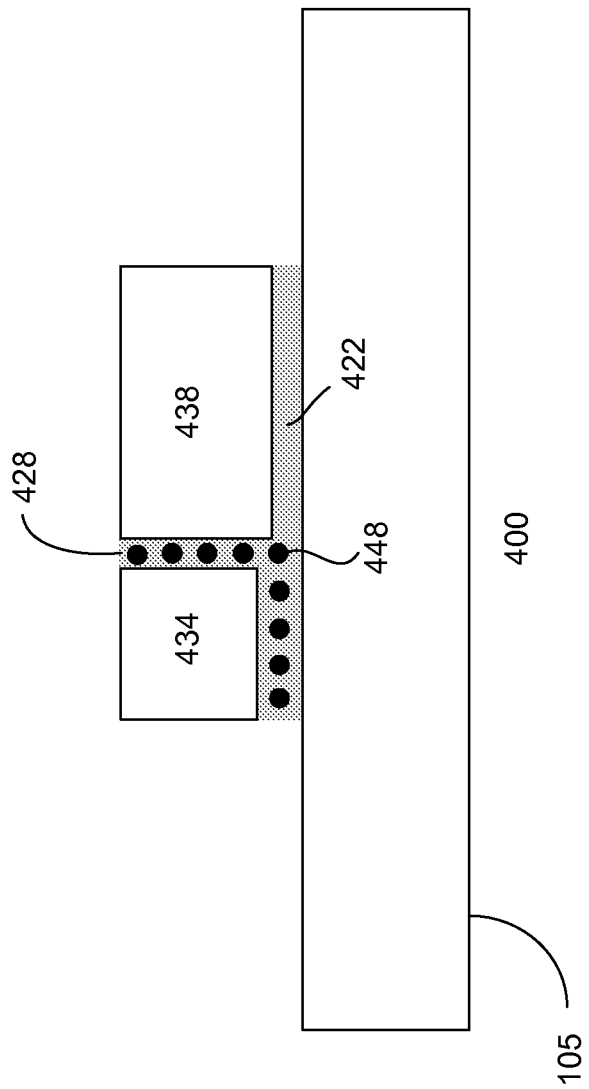

As shown in FIG. 4e, the substrate is patterned to form a split gate structure of a memory cell. As shown, the substrate is patterned to form one split gate structure. It is understood that the patterning of the substrate can form an array of split gate structures of memory cells. Techniques, such as mask and etch, can be used to pattern the substrate. For example, a soft mask, such as photo-resist, can be used. An ARC layer can be provided beneath the soft mask. Using the patterned soft mask, an anisotropic etch, such as RIE, patterns the gate layers to create the desired structure. After the substrate is patterned, the soft mask is removed.

FIGS. 4f and $4f_{top}$ show cross-sectional and top views of the substrate at the next stage of processing are shown. In one embodiment, first sidewall spacers 441 are formed on the sidewalls of the split gate structure. The sidewall spacers, in one embodiment, comprise thin spacers. The thin spacers, for example, are about 100-300 Å thick. The spacers should be sufficiently thin to enable formation of source/drain extension and halo regions. To form the spacers, a dielectric spacer layer, such as a layer of oxide, nitride or a combination thereof, is formed on the substrate and anisotropically etched by, for example, RIE. The etch removes horizontal portions of the spacer dielectric layer, leaving sidewall spacers.

A mask layer 482 is formed on the substrate. The mask layer, for example, comprises a photo-resist layer. The thickness $T_M$ of the mask layer should be sufficient to prevent dopants of a subsequent implant from penetrating through to the substrate. The mask thickness, for example, is about 1000-3000 Å. Other thicknesses may also be useful. The mask layer is patterned to form first and second windows 484 and 486 adjacent to the edges of the gate structure.

In one embodiment, the first window is adjacent to a first terminal side of the split gate structure and comprises a length $L_S$; the second window is adjacent to a second terminal side of the split gate structure and comprises a length $L_D$. The first terminal, in one embodiment, is adjacent to the first gate of the split gate structure and the second terminal is adjacent to the second gate of the split gate structure. The first terminal, for example, serves as the source terminal while the second terminal serves as the drain terminal.

The patterned mask layer serves as an implant mask for forming extension regions adjacent to the first and second gates and an e-field equalizer adjacent to the first gate.

In one embodiment, the e-field equalizer comprises a heavily doped e-region 466 under the first gate adjacent to the first terminal side. In one embodiment, the e-field equalizer comprises a halo region. The doped halo region comprises a heavily doped region with dopants of the first polarity type. Forming the doped halo region, in one embodiment, comprises performing an angled implant. The angle of the implant, for example, is about 20°-45° with respect to a plane of the source edge of the split gate structure in a direction towards the drain.

In one embodiment, lengths $L_S$ and $L_D$ of the windows are selected to form the doped halo region under the split gate structure at the source side while using halo shadow effects to prevent a doped region from being formed under the mask layer at the drain side. To facilitate halo shadow effects, $L_S$ is greater than $L_D$. The window lengths $L_S$ and $L_D$ may depend on factors such as implant angle and mask thickness. In one embodiment, $L_D$ may be optimized based on the implant angle while $L_S$ may be about 0.1-1 µm. Preferably, the lengths $L_S$ and $L_D$ are selected based on implant angle and mask thickness so that the halo region is formed with the desired parameters under the split gate structure at the source side. Providing other implant parameters such as implant angle, window lengths $L_S$ and $L_D$ as well as mask thickness may also be useful.

The mask layer is also used to form source/drain extension regions 419 adjacent to the edge of the gate structure. The extension regions are formed with an implant. The implant, for example, comprises implanting dopants of the second polarity type at an angle which is perpendicular to the surface of the substrate. That is implant angle is equal to 0°. After forming the extension regions and halo e-region, the patterned mask layer is removed.

In FIG. 4g, the process continues to form second sidewall spacers 442 on the thin spacers. Forming the second spacers, for example, comprises depositing a dielectric layer and anisotropically etching the layer to remove the horizontal portions. The second and thin spacers together form the final spacers on the sidewalls of the gate structure. The thickness of the final spacer is about 200-500 Å. Subsequently, the first and second terminal regions 411 and 416 are formed adjacent to the gate structure. In one embodiment, second polarity type dopants are implanted using an implant mask (not shown) to form the first and second terminal regions.

The process continues to form the device. For example, additional processing can include removing the mask layer, forming salicide contacts, filling gaps with dielectric material, forming one or more interconnect levels, final passivation, dicing, assembly and packaging. Other processes are also useful. For example, other components, such as LV, HV and I/O devices can be formed prior to forming the interconnections. The memory cells can be formed as a memory device or embedded into a part of ICs.

Figure 5C:
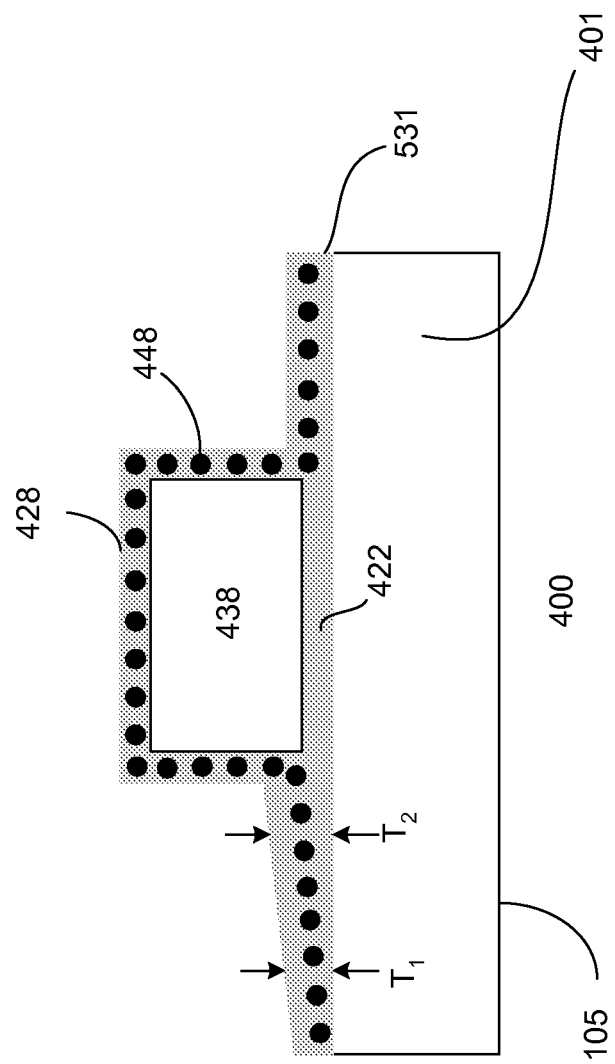

FIGS. 5a-d show cross-sectional views of another embodiment of a process for forming a device or IC. FIG. 5a shows a substrate 105 prepared with a patterned second gate stack with a second gate electrode 438 over a second gate dielectric layer 422, similar to that described in FIG. 4a.

The process continues to commence forming an inter-gate dielectric layer, covering the substrate and second gate stack. The inter-gate dielectric layer, for example, comprises nano-crystals. The inter-gate dielectric layer can comprise multiple layers, as described in FIG. 4b. In one embodiment, the inter-gate dielectric layer comprises an e-field equalizer which is disposed adjacent to the first gate. The e-field equalizer comprises an inter-gate dielectric having a gradient or sloping surface below the first gate.

Referring to FIG. 5b, a bottom oxide layer 531 of the inter-gate dielectric layer is formed, covering the substrate and second gate stack. The bottom oxide comprises a tunnel oxide. The bottom oxide can be formed by thermal oxidation, such as steam or dry oxidation, at a temperature of about 800-1050° C. Other techniques for forming the bottom oxide are also useful. The bottom oxide layer comprises a gradient or slope. The slope is tailored to produce a more uniform e-field under the first gate which results in more uniform charge trapping. Preferably, the slope is tailored to produce a substantially uniform e-field under the first gate. The gradient of the oxide layer alters, for example, the vertical e-field under the first gate. In one embodiment, the slope is about 2°-10°.

The gradient can be achieved by, in one embodiment, implanting different amounts of dopant species into the substrate prior to forming the bottom oxide layer. In one embodiment, the dopant species implanted retards oxidation. Dopant species which retards oxidation, in one embodiment, comprises $N_2$. Other types of dopant species which retard oxidation are also useful. The thickness of the bottom oxide corresponding to the regions of the substrate having greater amount of the dopant will be thinner than that corresponding to the regions having a lesser amount of the dopant.

To produce a bottom oxide with a gradient such that it is thicker at the interface of the first and second gates than at the first terminal side, a greater amount of oxidation retarding (OR) dopants are implanted at the first terminal side than at the interface of the gates. This can be accomplished by implanting the OR dopants at an angle. In one embodiment, the dopants are implanted at an angle θ of about 7°-45°. The angle θ is the angle from a plane parallel to the edge of the gate structure at the non-first gate side towards the first gate side, as illustrated in FIG. 5a. The angle, energy and dose of the implant can be tailored to produce a bottom oxide layer with the desired gradient. In one embodiment, the implant is performed at an angle of about 7°-45°, a dose of about 1E13 cm$^{-2}$ to 1E14 cm$^{-2}$ and at an energy of about 1 KeV to 20 KeV.

Referring to FIG. 5c, the process continues to form an inter-gate dielectric layer with nano-crystals. For example, a second layer 428 in which nano-crystals will be formed is deposited on the substrate. The second layer is formed over the bottom oxide. The thickness of the second layer can be, for example, about 30-500 Å. In one embodiment, the second layer comprises a polysilicon or an amorphous silicon layer which will be processed to form silicon nano-crystals. Alternatively, the second layer may comprise germanium (Ge) to form Ge nano-crystals.

To form nano-crystals 448, the second layer is processed by, for example, an anneal. The anneal can be performed at a temperature of about 750-1100° C. in a NO/$N_2$ or $N_2$/$O_2$ ambient. The size of the nano-crystals can range from about 30-400 Å. Other processing parameters, types of ambient or nano-crystal size may also be useful.

In one embodiment, a third layer is deposited over the nano-crystals. The third layer, for example, comprises an oxide layer which caps the nano-crystals. Techniques such as CVD or rapid thermal CVD (RTCVD) can be employed to form the third layer. The thickness of the third or cap layer is about 100-250 Å. The cap layer improves tunneling voltage. In one embodiment, the cap layer comprises a HTO layer. Providing other configurations of the dielectric stack may also be useful. For example, other materials, thicknesses or deposition techniques can be used. Other configurations or types of the inter-gate dielectric layer may also be useful.

Figure 5D:
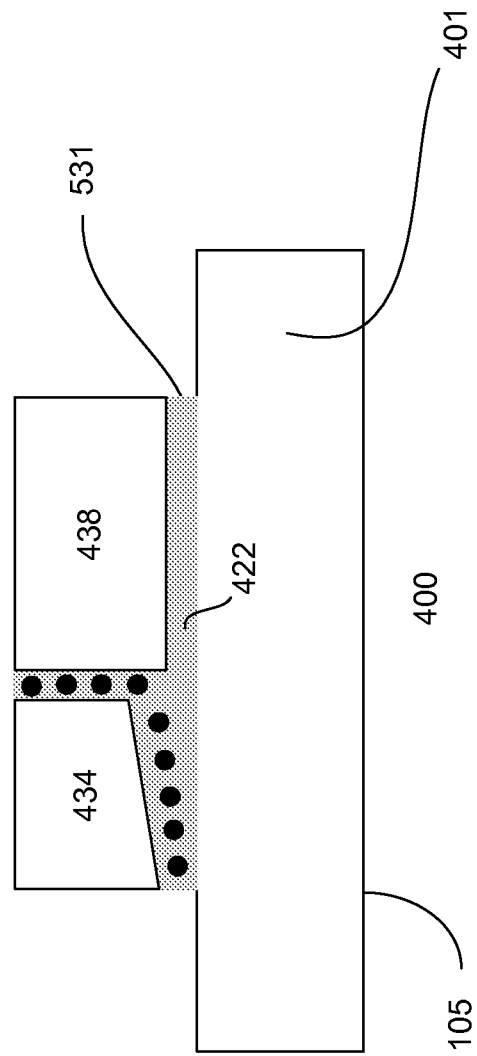

The process continues by forming a first gate electrode layer on the substrate, as described in FIG. 4c. The substrate is then planarized, as described in FIG. 4d, to form top surfaces of the gates which are coplanar. This results in removing the inter-gate dielectric layer on the top of the first gate. Referring to FIG. 5d, the substrate is patterned to form a split gate structure of a memory cell. Techniques, such as mask and etch, can be used to pattern the substrate. For example, a soft mask, such as photo-resist, can be used. An ARC layer can be provided beneath the soft mask. Using the patterned soft mask, an anisotropic etch, such as RIE, patterns the gate layers to create the desired structure. After the substrate is patterned, the soft mask is removed. The process continues to form the device as described in FIG. 4g and onwards.

In another embodiment, processing of the split gate structure of FIG. 5d continues by forming an e-field equalizer comprising a heavily doped e-region, such as a halo region as described in FIGS. 4f and 4f$_{top}$. The process continues to form the device as described in FIG. 4g and onwards. This results in a memory cell with an e-field equalizer comprising a graded inter-gate dielectric layer beneath the first gate and a heavily doped e-region such as a halo region.

In another embodiment, the planarizing process described in FIG. 4d is not performed. After the first gate electrode is formed, the substrate is patterned to form split gate structure in which the first gate overlaps a portion of the second gate. Exposed portions of the inter-gate dielectric layer are removed. The split gate structure can be processed as described. For example, the split gate structure can be processed to include an e-field equalizer comprising a doped halo region. Alternatively, the split gate structure can include a graded inter-gate dielectric layer beneath the first gate in lieu or in addition to the doped halo region.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A semiconductor device comprising:
a substrate;
a split gate structure disposed on the substrate, wherein the split gate structure comprises
a second gate disposed on the substrate;
an inter-gate dielectric layer disposed on the substrate and over the second gate;
a first gate, wherein the first gate is adjacent to and separated from the second gate by the inter-gate dielectric layer,
wherein the inter-gate dielectric layer below the first gate and between the first and second gates corresponds to a charge storage layer, the first and second gates include first and second adjacent sidewalls which are adjacent to the first and second gates and first and second non-adjacent sidewalls;
a first diffusion region adjacent to the first non-adjacent sidewall of the first gate and a second diffusion region adjacent to the second non-adjacent sidewall of the second gate; and
an e-field equalizer which at least extends from the first non-adjacent sidewall to below
the first gate, wherein the e-field equalizer improves uniformity of an e-field across the first gate during operation to improve charge trapping capabilities of the charge storage layer.

2. The semiconductor device of claim 1 wherein the first gate comprises a control gate and the second gate comprises a select gate.

3. The semiconductor device of claim 1 wherein the first diffusion region comprises a first extension region adjacent to the edge of the first gate and the second diffusion region comprises a second extension region adjacent to the edge of the second gate.

4. The semiconductor device of claim 1 wherein the first diffusion region serves as a source terminal and the second diffusion region serves as a drain terminal.

5. The semiconductor device of claim 1 wherein the inter-gate dielectric layer comprises nano-crystals having charge storage capacity.

6. The semiconductor device of claim 1 wherein the e-field equalizer comprises a heavily doped e-region of a first polarity type adjacent to the first diffusion region and contacts at least a portion of the charge storage layer.

7. The semiconductor device of claim 6 wherein the first and second gates have co-planar top surfaces.

8. The semiconductor device of claim 6 wherein the e-field equalizer comprises a portion of the inter-gate dielectric layer having a thickness gradient disposed on the substrate and beneath the first gate.

9. The semiconductor device of claim 8 wherein the thickness gradient is such that it is thicker at an interface of the first and second gates than at the first diffusion region.

10. The semiconductor device of claim 6 wherein the first gate overlaps the second gate.

11. The semiconductor device of claim 1 wherein the e-field equalizer comprises a portion of the inter-gate dielectric layer having a thickness gradient disposed on the substrate and beneath the first gate.

12. The semiconductor device of claim 11 wherein the thickness gradient is such that it is thicker at an interface of the first and second gates than at the first diffusion region.

13. A device comprising:
a substrate with a first feature having first and second sidewalls, wherein the first feature includes a dielectric layer which serves as a charge storage layer below the first feature and on the substrate;
a first diffusion region in the substrate adjacent to the first sidewall of the first feature; and
an e-field equalizer which at least extends from the first sidewall to below the first feature, wherein the e-field equalizer improves uniformity of e-field across the distance between the first and second sidewalls of the first feature during operation to improve charge trapping capabilities of the charge storage layer and wherein the e-field equalizer comprises a heavily doped e-region of a first polarity type adjacent to the first diffusion region and contacts at least a portion of the charge storage layer.

14. The device of claim 13 wherein the e-field equalizer comprises a portion of the dielectric layer having a thickness gradient disposed on the substrate and beneath the first gate.

15. The device of claim 14 wherein the thickness gradient is such that it is thicker at the second sidewall of the first feature than at the first diffusion region.

16. A device comprising:
a substrate with a first feature having first and second sidewalls, wherein the first feature includes a dielectric layer which serves as a charge storage layer below the first feature and on the substrate;
a first diffusion region in the substrate adjacent to the first sidewall of the first feature; and
an e-field equalizer which at least extends from the first sidewall to below the first feature, wherein the e-field equalizer improves uniformity of e-field across the distance between the first and second sidewalls of the first feature during operation to improve charge trapping capabilities of the charge storage layer and wherein the e-field equalizer comprises a portion of the dielectric layer having a thickness gradient disposed on the substrate and beneath the first gate.

17. The device of claim 13 comprises a second feature adjacent to the second sidewall of the first feature.

18. The device of claim 17 wherein the first and second features have co-planar top surfaces.

19. The device of claim 17 wherein the first feature overlaps the second feature.

20. The device of claim 16 comprises a second feature adjacent to the second sidewall of the first feature and wherein the first feature overlaps the second feature.

* * * * *